United States Patent
Jeong et al.

(10) Patent No.: US 12,464,828 B2
(45) Date of Patent: Nov. 4, 2025

(54) THIN-FILM SOLAR CELL CAPABLE OF INDEPENDENTLY ADJUSTING TRANSPARENCY AND COLOR AND METHOD OF MANUFACTURING THE SAME

(71) Applicant: KOREA INSTITUTE OF SCIENCE AND TECHNOLOGY, Seoul (KR)

(72) Inventors: Jeung-hyun Jeong, Seoul (KR); Gee Yeong Kim, Seoul (KR); Won Mok Kim, Seoul (KR); Eun Pyung Choi, Seoul (KR); Seonghoon Jeong, Seoul (KR); Kyeong Seok Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 42 days.

(21) Appl. No.: 18/454,491

(22) Filed: Aug. 23, 2023

(65) Prior Publication Data
US 2024/0204122 A1    Jun. 20, 2024

(30) Foreign Application Priority Data

Dec. 20, 2022   (KR) ........................ 10-2022-0179157

(51) Int. Cl.
*H10F 19/30*     (2025.01)
*H10F 71/00*     (2025.01)
(Continued)

(52) U.S. Cl.
CPC ......... *H10F 19/30* (2025.01); *H10F 71/1385* (2025.01); *H10F 77/219* (2025.01); *H10F 77/311* (2025.01); *H10F 77/45* (2025.01)

(58) Field of Classification Search
None
See application file for complete search history.

(56) References Cited

U.S. PATENT DOCUMENTS

| | | |
|---|---|---|
| 2012/0037228 A1 | 2/2012 | Fu |
| 2013/0269765 A1* | 10/2013 | Lim ........................ H10F 77/00 136/256 |

(Continued)

FOREIGN PATENT DOCUMENTS

| | | |
|---|---|---|
| JP | 2002-314114 A | 10/2002 |
| JP | 2002-343998 A | 11/2002 |

(Continued)

OTHER PUBLICATIONS

Korean Office Action issued on Jul. 25, 2024, in counterpart Korean Patent Application No. 10-2022-0179157 (3 pages in English, 3 pages in Korean).

*Primary Examiner* — Jayne L Mershon
(74) *Attorney, Agent, or Firm* — NSIP Law

(57) ABSTRACT

The present disclosure relates to a thin-film solar cell capable of independently adjusting transparency and color, which is capable of selectively controlling transmittance while independently adjusting external and internal colors within a range in which degradation of photoelectric conversion efficiency is minimized, and a method of manufacturing the same, and the thin-film solar cell capable of independently adjusting transparency and color according to the present disclosure includes a structure in which a back transparent electrode, a light absorption layer, a front transparent electrode, and a front color layer are sequentially stacked on a transparent substrate, in which a light transmission part region, to which the back transparent electrode is exposed, is formed by removing the front color layer, the front transparent electrode, and the light absorption layer.

11 Claims, 11 Drawing Sheets

(51) Int. Cl.
*H10F 77/20* (2025.01)
*H10F 77/30* (2025.01)
*H10F 77/45* (2025.01)

(56) References Cited

U.S. PATENT DOCUMENTS

| | | | |
|---|---|---|---|
| 2017/0278995 A1* | 9/2017 | Haight | H10F 10/16 |
| 2018/0108795 A1* | 4/2018 | Jeong | H10F 77/127 |
| 2020/0411705 A1 | 12/2020 | Lim et al. | |

FOREIGN PATENT DOCUMENTS

| | | |
|---|---|---|
| JP | 2012-248824 A | 12/2012 |
| JP | 6661664 B2 | 3/2020 |
| KR | 10-2012-0136986 A | 12/2012 |
| KR | 10-2013-0049139 A | 5/2013 |
| KR | 10-2013-0115825 A | 10/2013 |
| KR | 10-1688401 B1 | 12/2016 |
| KR | 10-1858570 B1 | 5/2018 |
| KR | 10-2021-0001841 A | 1/2021 |

* cited by examiner

FIG. 9

| ITO bottom thickness (t1, nm) | ITO total thickness (t1+t2, nm) | | | | |
|---|---|---|---|---|---|
| | 100 | 150 | 200 | 250 | 300 |
| 10 | 211, 186, 173 | 163, 178, 214 | 179, 221, 181 | 236, 189, 186 | 179, 181, 200 |
| 20 | 223, 200, 180 | 172, 176, 207 | 167, 218, 197 | 237, 202, 180 | 196, 179, 207 |
| 30 | 232, 214, 189 | 183, 178, 196 | 161, 211, 210 | 231, 215, 176 | 212, 180, 208 |
| 40 | 236, 227, 201 | 195, 182, 184 | 162, 202, 217 | 218, 224, 174 | 227, 184, 202 |
| 50 | 232, 233, 212 | 208, 188, 174 | 168, 191, 215 | 202, 228, 176 | 238, 190, 190 |
| 60 | 223, 230, 218 | 221, 196, 168 | 175, 182, 205 | 186, 225, 181 | 243, 198, 176 |
| 70 | 212, 220, 216 | 231, 205, 166 | 182, 175, 190 | 172, 216, 189 | 241, 206, 163 |
| 80 | 201, 205, 206 | 237, 213, 170 | 188, 172, 176 | 165, 209, 198 | 232, 213, 155 |
| 90 | 191, 190, 192 | 236, 220, 181 | 198, 171, 165 | 163, 199, 204 | 216, 216, 153 |
| 100 | 181, 178, 180 | 228, 223, 195 | 207, 174, 159 | 164, 177, 206 | 196, 217, 159 |
| 110 | | 215, 220, 209 | 216, 180, 160 | 167, 167, 203 | 176, 213, 170 |
| 120 | | 200, 211, 217 | 223, 190, 166 | 171, 162, 197 | 160, 206, 185 |
| 130 | | 187, 200, 215 | 228, 202, 177 | 177, 162, 189 | 150, 195, 201 |
| 140 | | 177, 190, 206 | 226, 214, 192 | 184, 166, 181 | 146, 185, 212 |
| 150 | | 168, 183, 194 | 219, 222, 207 | 194, 174, 176 | 148, 181, 215 |
| 160 | | | 209, 225, 217 | 204, 185, 173 | 154, 178, 208 |
| 170 | | | 198, 221, 217 | 215, 198, 174 | 163, 175, 195 |
| 180 | | | 190, 212, 206 | 224, 213, 178 | 173, 176, 180 |
| 190 | | | 185, 202, 190 | 228, 225, 185 | 186, 180, 166 |
| 200 | | | 182, 191, 175 | 227, 231, 196 | 201, 186, 157 |
| 210 | | | | 222, 229, 205 | 216, 193, 154 |
| 220 | | | | 214, 219, 208 | 229, 203, 156 |
| 230 | | | | 206, 204, 204 | 238, 212, 165 |
| 240 | | | | 197, 190, 195 | 240, 219, 179 |
| 250 | | | | 189, 178, 185 | 234, 222, 196 |
| 260 | | | | | 222, 219, 210 |
| 270 | | | | | 207, 211, 215 |
| 280 | | | | | 192, 200, 208 |
| 290 | | | | | 180, 190, 195 |
| 300 | | | | | 170, 163, 180 |

THIN-FILM SOLAR CELL CAPABLE OF INDEPENDENTLY ADJUSTING TRANSPARENCY AND COLOR AND METHOD OF MANUFACTURING THE SAME

CROSS REFERENCE TO RELATED APPLICATION

This application claims the priority of Korean Patent Application No. 10-2022-0179157 filed on Dec. 20, 2022, in the Korean Intellectual Property Office, the disclosure of which is incorporated herein by reference.

BACKGROUND OF THE INVENTION

Field of the Invention

The present disclosure relates to a thin-film solar cell capable of independently adjusting transparency and color and a method of manufacturing the same, and more particularly, to a thin-film solar cell capable of independently adjusting transparency and color, which is capable of selectively controlling transmittance while independently adjusting external and internal colors within a range in which degradation of photoelectric conversion efficiency is minimized, and a method of manufacturing the same.

DESCRIPTION OF NATIONAL SUPPORT RESEARCH AND DEVELOPMENT

This research was supported by the National Research Foundation of Korea (NRF) funded by Ministry of Science and ICT ([Climate Change Response Technology Development, Development of High-Efficiency Transparent CIGS Photovoltaic Module, Project No. 2019M1A2A2072412] and [Leapfrog Carbon Neutral Technology Development, Development of Highly-efficient and non-toxic CIGS thin-film solar cells on flexible and lightweight substrates(CO3), Project No. 2022M3J1A1085373]).

DESCRIPTION OF THE RELATED ART

Window solar cell modules are technologies for replacing windows of buildings with solar cell modules, and the window solar cell module is one of the main technologies of building integrated photovoltaic (BIPV) technologies. To replace the window of the building with the solar cell module, it is necessary to implement excellent light transmission and aesthetic colors that are characteristics of the window. That is, the window solar cell module needs to have excellent photoelectric conversion efficiency and implement light transmission and color characteristics.

Currently, most of the color BIPV technologies that focus on external appearances are based on crystalline silicon solar cells. In the modularization of the crystalline silicon solar cell, colors are implemented by a method such as a method of attaching a color panel to a back sheet. However, the solar cell module based on the crystalline silicon solar cell has a disadvantage in that a manufacturing process is complicated, manufacturing costs are high, and installation costs are high because the solar cell module is heavy in weight. In addition, it is difficult to apply the solar cell module to the window BIPV technologies because it is not easy to implement a light transmission function.

Therefore, recently, research and development have been actively conducted on window solar cell modules using thin-film solar cells. The development of window solar cell modules based on amorphous silicon solar cells, dye-sensitized solar cells, organic solar cells, and CIGS solar cells is representative.

Meanwhile, the above-mentioned window solar cell module needs to have excellent photoelectric conversion efficiency, light transmission, and color characteristics. However, it is difficult to satisfy all of these characteristics because of the trade-off between the photoelectric conversion efficiency and the color characteristics. In addition, the technology to independently control the transmittance is also challenging to implement in order to ensure excellent photoelectric conversion efficiency, light transmittance, and color characteristics. Further, there have been no reported technologies that simultaneously control the front and back colors of solar cell modules independently and control the transmittance.

Regarding the related art, Japanese Patent No. 6661664 discloses a technology in which a light transmission opening 53 is formed in a thin-film photoelectric conversion element 20, and a color layer 50 is provided on a back surface of a lower transparent substrate 30, thereby implementing an external color by means of light reflection of the color layer 50. However, the technology disclosed in Japanese Patent No. 6661664 can implement only the external color but cannot implement an internal color. U.S. Patent Application Publication No. US 2017-0278995 discloses a technology that can implement various colors by providing a plurality of transparent layers that generates constructive interference among wavelengths reflected on a front transparent electrode (TCO) at the time of configuring a thin-film solar cell. However, like the technology of Japanese Patent No. 6661664, the technology disclosed in U.S. Patent Application Publication No. US 2017-0278995 can implement only external colors but cannot adjust transmittance.

In addition, Korean Patent Application Laid-Open No. 2013-0115825 discloses a technology that can adjust external and internal colors independently by adjusting thicknesses of front and back transparent electrodes of a thin-film solar cell. However, there is a problem in that this technology cannot adjust the transmittance, and the photoelectric conversion efficiency is dependent on the reflectance of the front transparent electrode.

SUMMARY OF THE INVENTION

The present disclosure has been made in an effort to solve the above-mentioned problems, and an object of the present disclosure is to provide a thin-film solar cell capable of independently adjusting transparency and color, which is capable of selectively controlling transmittance while independently adjusting external and internal colors within a range in which degradation of photoelectric conversion efficiency is minimized, and a method of manufacturing the same.

To achieve the above-mentioned object, a thin-film solar cell capable of independently adjusting transparency and color according to the present disclosure includes: a structure in which a back transparent electrode, a light absorption layer, a front transparent electrode, and a front color layer are sequentially stacked on a transparent substrate, in which a light transmission part region, to which the back transparent electrode is exposed, is formed by removing the front color layer, the front transparent electrode, and the light absorption layer.

An external color of the thin-film solar cell may be implemented by the front color layer, an internal color of the thin-film solar cell may be implemented by the back transparent electrode, and light transmittance may be determined by adjusting an area of the light transmission part region.

Characteristics of the external color implemented by the front color layer, characteristics of the internal color implemented by the back transparent electrode, and characteristics of light transmittance by adjusting the area of the light transmission part region may be independently adjustable.

The back transparent electrode may have a structure in which a lower transparent conductive oxide, a conductive metal, and an upper transparent conductive oxide are sequentially stacked, and the internal color exhibited by the back transparent electrode may be adjustable by adjusting thicknesses of the lower and upper transparent conductive oxides.

In addition, it is possible to adjust electrode resistance by adjusting the thickness of the conductive metal and adjust the internal color with various color sensation by adjusting the thicknesses of the upper and lower transparent conductive oxide.

The front color layer may have a structure in which two types of transparent thin-film layers having different light refractive indexes are alternately and repeatedly stacked, and the external color exhibited by the front color layer may be adjustable by adjusting thicknesses and the number of stacking layers of the two types of transparent thin-film layers having different light refractive indexes.

The back transparent electrode may be configured by a single layer made of a transparent conductive oxide.

The light absorption layer may serve to create electron-positive hole pairs by means of photoelectric conversion of received light.

A method of manufacturing a thin-film solar cell capable of independently adjusting transparency and color according to the present disclosure includes: stacking a back transparent electrode on a transparent substrate; stacking a light absorption layer on the back transparent electrode; stacking a front transparent electrode on the light absorption layer; stacking a front color layer on the front transparent electrode; and forming a light transmission part region, to which the back transparent electrode is exposed, by removing the front color layer, the front transparent electrode, and the light absorption layer in a particular region.

An external color of the thin-film solar cell may be implemented by the front color layer, an internal color of the thin-film solar cell may be implemented by the back transparent electrode, light transmittance may be determined by adjusting an area of the light transmission part region, and characteristics of the external color implemented by the front color layer, characteristics of the internal color implemented by the back transparent electrode, and characteristics of light transmittance by adjusting the area of the light transmission part region may be independently adjustable.

The forming of the light transmission part region, to which the back transparent electrode is exposed, by removing the front color layer, the front transparent electrode, and the light absorption layer in the particular region may include removing the front color layer, the front transparent electrode, and the light absorption layer in the particular region by irradiating a rear surface of the substrate with a laser.

The thin-film solar cell capable of independently adjusting transparency and color and the method of manufacturing the same according to the present disclosure provide the following effects.

It is possible to implement the external color by the front color layer, implement the internal color by the back transparent electrode, and independently adjust light transmittance by adjusting the area of the light transmission part region within a range in which degradation of photoelectric conversion efficiency of the thin-film solar cell is minimized. Therefore, it is possible to effectively cope with various demands for the window solar cell module.

BRIEF DESCRIPTION OF THE DRAWINGS

FIG. 9 is a reference view illustrating a result of calculating colors (numbers inside are R. G, and B codes) implemented according to a change in t1 thickness for a total thickness of various ITO layers (lower ITO layer thickness {t1}+upper ITO layer thickness {t2}).

DETAILED DESCRIPTION OF THE INVENTION

The present disclosure provides a technology related to a thin-film solar cell capable of selectively controlling transmittance while independently adjusting external and internal colors within a range in which degradation of photoelectric conversion efficiency is minimized.

The characteristics required for a window solar cell module may be broadly summarized as photoelectric conversion efficiency, color implementation, and transmittance. It can be said that in replacing windows of buildings with solar cell modules, the better the photoelectric conversion efficiency of the solar cell module, the better the solar cell module. It is also essential to apply solar cell modules that can implement various colors to meet the various needs of customers. The colors of the window solar cell modules are classified into an external color and an internal color. In general, the window solar cell modules are focused on the implementation of external colors. However, the demand for implementing internal colors is gradually increasing, such that implementing internal colors is also one of the essential requirements for window solar cell modules. In addition, as the solar cell module is applied to a window, the light transmittance of the solar cell module also needs to be ensured at a certain level or higher.

As such, the requirements for window solar cell modules include photoelectric conversion efficiency, implementation of external and internal colors, and transmittance characteristics. These characteristics have trade-offs, as described in the 'Background Art'. For example, in order to achieve colors, a reduction in photoelectric conversion efficiency needs to be sacrificed. Furthermore, no thin-film solar cells have been proposed that simultaneously satisfy these requirements.

The present disclosure provides a technology related to a thin-film solar cell capable of independently controlling external and internal colors and independently controlling light transmittance under a condition in which degradation of photoelectric conversion efficiency is minimized at the time of configuring the thin-film solar cell applied to the window solar cell module.

Hereinafter, a thin-film solar cell capable of independently adjusting transparency and color and a method of manufacturing the same according to the embodiment of the present disclosure will be described in detail with reference to the drawings.

Figure 1:
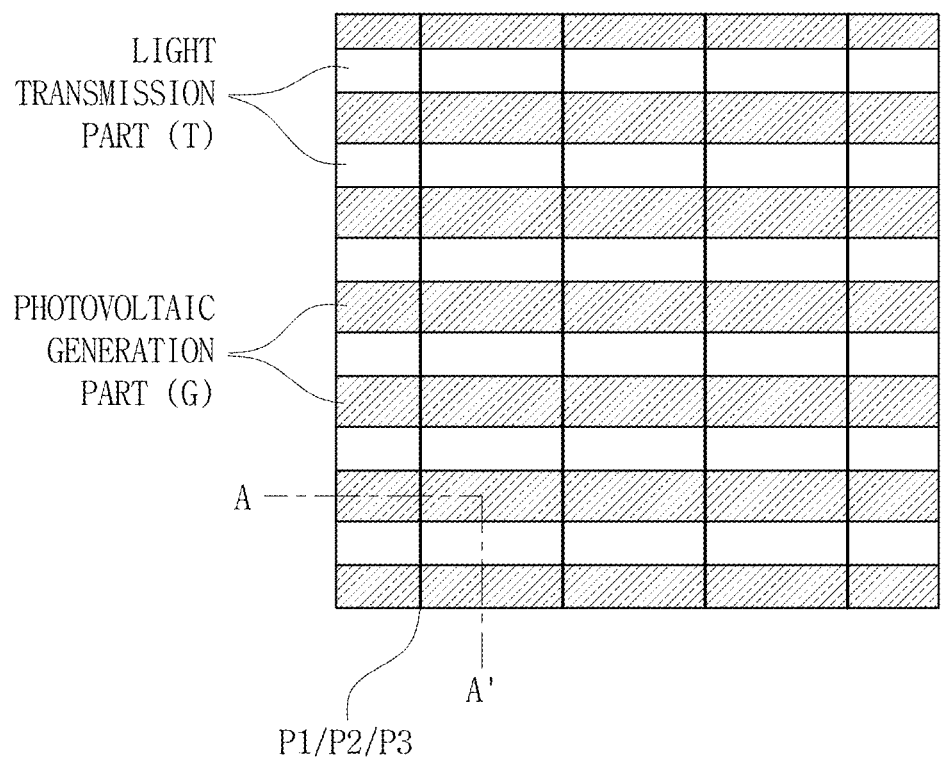
FIG. 1 is a top plan view of a thin-film solar cell capable of independently adjusting transparency and color according to an embodiment of the present disclosure.
Figure 2:
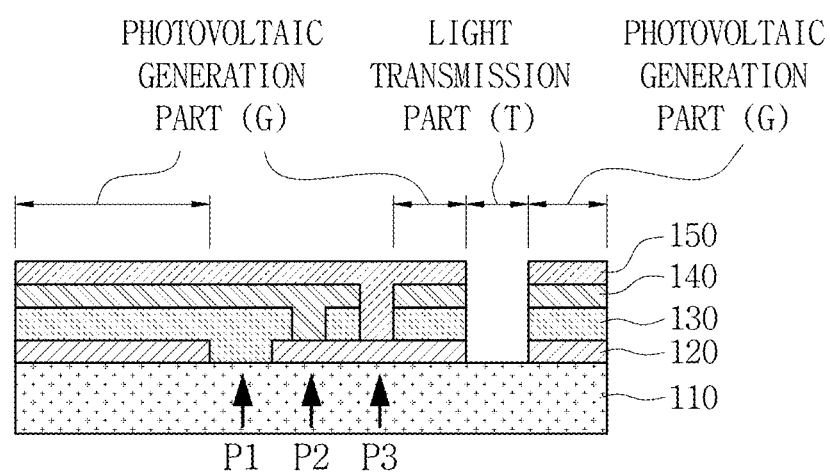
FIG. 2 is a cross-sectional view taken along line A-A' in FIG. 1.

With reference to FIGS. 1 and 2, a thin-film solar cell 10 capable of independently adjusting transparency and color according to an embodiment of the present disclosure has a structure in which a back transparent electrode 120, a light absorption layer 130, a front transparent electrode 140, and a front color layer 150 are sequentially stacked on a transparent substrate 110.

The light enters a front surface of the thin-film solar cell, and the incident light is photoelectrically converted by the light absorption layer 130, such that electric power is produced. In addition, the external color is implemented by the front color layer 150, and the internal color is implemented by the back transparent electrode 120. In this case, when the thin-film solar cell of the present disclosure is applied to a window solar cell module, the thin-film solar cell is disposed so that the front color layer 150 is directed toward the outside of a building, and the transparent substrate 110 is directed toward the inside of the building.

A light transmission part region T is provided to implement the transmittance and internal color of the thin-film solar cell. The light transmission part region T refers to an area in which the back transparent electrode 120 is exposed as the front color layer 150, the front transparent electrode 140, and the light absorption layer 130 are removed. In the light transmission part region T, the light immediately enters the back transparent electrode 120. As described above, in the light transmission part region T, the incident light enters the back transparent electrode 120 instead of the front color layer 150, such that photoelectric conversion is not performed by the light absorption layer 130, and the light is transmitted through the back transparent electrode 120 and the transparent substrate 110.

The transmission of the light through the back transparent electrode 120 and the transparent substrate 110 means that the light transmission of the thin-film solar cell is ensured. In addition, in the present disclosure, the transmission of the light through the back transparent electrode 120 and the transparent substrate 110 means that the internal color is implemented by a light transmission interference color as light interference is generated by a plurality of interfaces present in the back transparent electrode 120 having the multilayer structure. That is, with the light transmission part region T, it is possible to ensure light transmittance characteristics and implement the internal color viewed from the inside.

To implement the internal color by means of the back transparent electrode 120 in the light transmission part region T, the back transparent electrode 120 may be made of a combination of a transparent conductive oxide (TCO) and a conductive metal having excellent electrical conductivity. In one embodiment, the back transparent electrode 120 may be configured by a three-layer structure in which a lower transparent conductive oxide, a conductive metal, and an upper transparent conductive oxide are sequentially stacked.

As the transparent conductive oxide, any one selected from a group consisting of indium oxide ($In_2O_3$) doped with one or two or more metals selected from tin (Sn), molybdenum (Mo), tungsten (W), and titanium (Ti), tin oxide ($SnO_2$) doped with fluorine (F) or antimony (Sb), zinc oxide (ZnO) doped with one or two or more elements selected from elements including aluminum (Al), gallium (Ga), indium (In), boron (B), fluorine (F), and hydrogen (H), a mixed oxide (IZO) of an indium oxide and a zinc oxide, and a mixed oxide (ZTO) of a zinc oxide and a tin oxide may be used. As the conductive metal, any one of silver (Ag), gold (Au), platinum (Pt), aluminum (Al), and copper (Cu) having excellent electrical conductivity may be used. Further, alloys of two or more elements may be used to planarize the interface structure and ensure thermal/mechanical/chemical durability. In addition, for the lower transparent conductive oxide layer formed on the substrate, a material with light transmission may be applied instead, even though the material has low electrical conductivity. For example, metal oxides such as $SiO_2$ and $Al_2O_3$, nitrides such as SiNx and AlN, and fluorides such as $MgF_2$ may be applied as the lower transparent conductive oxide layer.

The color exhibited by the back transparent electrode 120 may be adjusted by adjusting thicknesses of the lower transparent conductive oxide, the conductive metal, and the upper transparent conductive oxide. In one embodiment, various colors such as R. G, and B may be implemented in case that ITO is used for the lower transparent conductive oxide and the upper transparent conductive oxide, and Ag is used for the conductive metal. More specifically, it can be seen from the calculation that various colors such as R, G, and B may be implemented by adjusting the thicknesses of the lower transparent conductive oxide and the upper transparent conductive oxide under a condition in which Ag is 15 nm, and a total thickness of the lower transparent conductive oxide and the upper transparent conductive oxide is within 300 nm (see FIG. 10). In addition, it is possible to control electrical resistance of the back transparent electrode 120 by adjusting the thickness of the conductive metal.

Meanwhile, a change in light transmission spectrum may, of course, be achieved in a case in which the back transparent electrode 120 is configured by the three-layer structure in which the lower transparent conductive oxide, the conductive metal, and the upper transparent conductive oxide are sequentially stacked as described above or a case in which the back transparent electrode 120 is configured by a multilayer structure having two or more layers including a metal layer and a transparent conductive oxide layer. The back transparent electrode layer 120 may be configured by a single layer made of a transparent conductive oxide. In this case, a separate color is not exhibited, but a transparent color is exhibited.

As described above, the internal color may be implemented by the back transparent electrode 120 by exposing the back transparent electrode 120 through the light transmission part region T. Further, it is possible to control transmittance of the thin-film solar cell by adjusting an area of the light transmission part region T. That is, it is possible to adjust the internal color by controlling the thickness of the thin-film layer (the lower transparent conductive oxide, the conductive metal, and the upper transparent conductive oxide) of the three-layer structure that constitutes the back transparent electrode 120. Further, it is possible to selectively control the transmittance of the thin-film solar cell by adjusting the area of the light transmission part region T.

In the above-mentioned configuration, the implementation of the internal color by the back transparent electrode 120 and the light transmittance implemented by adjusting the area of the light transmission part region T are independent variables that are not dependent on each other. This is because the implementation of the internal color made by adjusting the thickness of the thin-film layer constituting the back transparent electrode 120 and the control of the light transmittance by adjusting the area of the light transmission part region T do not affect each other. This means that the internal color and the light transmittance of the thin-film solar cell may be independently adjusted. However, the area of the light transmission part region T determines the light transmittance and affects the photoelectric conversion efficiency of the thin-film solar cell. This is because an increase in area of the light transmission part region T means a decrease in power generation area of the thin-film solar cell. Therefore, it is necessary to adjust the area of the light transmission part region T within a range in which the degradation of photoelectric conversion efficiency is minimized.

Meanwhile, a front color of the thin-film solar cell is determined by the front color layer 150 provided on the front transparent electrode 140. The light transmission part region T refers to a portion from which the front color layer 150, the front transparent electrode 140, and the light absorption layer 130 are removed by a predetermined region. Therefore, a majority of a region excluding the light transmission part region T defines a structure in which the transparent electrode, the back transparent electrode 120, the light absorption layer 130, the front transparent electrode 140, and the front color layer 150 are sequentially stacked. In this case, even a partial region of the region excluding the light transmission part region T corresponds to a scribing region P1 for insulation between the cells of the back transparent electrode 120, a scribing region P2 for connection between the cells of the back transparent electrode 120 and the front transparent electrode 140, and a scribing region P3 for insulation between the cells of the front transparent electrode 140 and does not define the structure in which the transparent electrode, the back transparent electrode 120, the light absorption layer 130, the front transparent electrode 140, and the front color layer 150 are sequentially stacked. In summary, the region excluding the light transmission part region T, region P1, region P2, and region P3 defines the structure, in which the transparent electrode, the back transparent electrode 120, the light absorption layer 130, the front transparent electrode 140, and the front color layer 150 are sequentially stacked, and corresponds to a photovoltaic generation part region G in which photoelectric conversion is performed by the light absorption layer 130. Region P1, region P2, and region P3 will be described in detail with reference to the method of manufacturing the thin-film solar cell to be described below.

The power generation implemented by the photoelectric conversion of the light absorption layer 130 is performed in the region excluding the light transmission part region T, region P1, region P2, and region P3, i.e., the photovoltaic generation part region G. However, because the front color layer 150 is provided all the regions excluding the light transmission part region T, the implementation of the front color by the front color layer 150 is somewhat independent of the photovoltaic generation part region G.

The front color layer 150 has a shape in which two types of transparent thin-film layers having different light refractive indexes are alternately and repeatedly stacked. The front color layer 150 has a basic structure of a distributed Bragg reflective filter (DBR) in which two materials having different light refractive indexes are periodically and repeatedly stacked with a quarter-wavelength thickness. The front color layer 150 is characterized in that only the light with a specific targeted wavelength band is selectively reflected, whereas the rest of the light with the other wavelength ranges is transmitted and reaches the light absorption layer. As the light absorption layer selectively reflects only the light with a particular wavelength range while transmitting light with all other wavelengths so that the transmitted light is absorbed by the light absorption layer, a loss of receiving light by the front color layer 150 is minimized. In addition, it is possible to selectively implement the color exhibited by the front color layer 150 by controlling a reflection center wavelength by adjusting thicknesses of the two types of transparent thin-film materials having different light refractive indexes. On the premise that transparency is ensured at a predetermined level or higher, various materials may be applied to the transparent thin-film layer. For example, a metal oxide may be applied as a transparent material. In one embodiment, $Al_2O_3$ and $SiO_2$ may be applied as the two types of metal oxides having different light refractive indexes, and the front color layer 150 may be configured by alternately and repeatedly stacking $Al_2O_3$ and $SiO_2$. In addition, various colors such as R. G, and B may be implemented by adjusting the thicknesses of $Al_2O_3$ and $SiO_2$ and the number of times $Al_2O_3$ and $SiO_2$ are stacked.

The front transparent electrode 140 may be configured by a single layer made of a transparent conductive oxide (TCO) to minimize a loss of absorption of light. The light absorption layer 130 serves to create electron-positive hole pairs by means of the photoelectric conversion of the received light. In one embodiment, the light absorption layer 130 may be made of $CuIn_{1-x}Ga_x(Se, S)_2$. However, the present disclosure is not limited thereto. Meanwhile, a buffer layer may be further provided between the light absorption layer 130 and the front transparent electrode 140.

The thin-film solar cell capable of independently adjusting transparency and color according to the embodiment of the present disclosure has been described above. Hereinafter, the method of manufacturing the thin-film solar cell capable of independently adjusting transparency and color according to the embodiment of the present disclosure will be described.

Figure 3A:
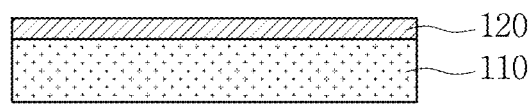
FIGS. 3A to 3H are process cross-sectional views for explaining a method of manufacturing the thin-film solar cell capable of independently adjusting transparency and color according to the embodiment of the present disclosure.

First, as illustrated in FIGS. 3A to 3H and 4, the back transparent electrode 120 is stacked on the transparent substrate 110 (see FIG. 3A (S101)).

The back transparent electrode 120 may be configured by the thin-film layer having the three-layer structure or the single layer made of the transparent conductive oxide (TCO) depending on whether to implement the color. In case that the back transparent electrode 120 is configured by the thin-film layer having the three-layer structure, various internal colors may be implemented by the back transparent electrode 120 by adjusting the thickness of the thin-film layer. In case that the back transparent electrode 120 is configured by the single layer made of the transparent conductive oxide (TCO), the internal color is an achromatic transparent color.

In case that the back transparent electrode 120 is configured by the thin-film layer having the three-layer structure, the back transparent electrode 120 is configured by a combination of the transparent conductive oxide (TCO) and the conductive metal having excellent electrical conductivity. Specifically, the back transparent electrode 120 is configured in the form in which the lower transparent conductive oxide, the conductive metal, and the upper transparent conductive oxide are sequentially stacked. In addition, as illustrated in FIG. 9, the color exhibited by the back transparent electrode 120 may be adjusted to R. G. B, and the like by adjusting the thicknesses of the lower transparent conductive oxide, the conductive metal, and the upper transparent conductive oxide.

As the transparent conductive oxide, any one selected from a group consisting of indium oxide ($In_2O_3$) doped with one or two or more metals selected from tin (Sn), molybdenum (Mo), tungsten (W), and titanium (Ti), tin oxide ($SnO_2$) doped with fluorine (F) or antimony (Sb), zinc oxide (ZnO) doped with one or two or more elements selected from elements including aluminum (Al), gallium (Ga), indium (In), boron (B), fluorine (F), and hydrogen (H), a mixed oxide (IZO) of an indium oxide and a zinc oxide, and a mixed oxide (ZTO) of a zinc oxide and a tin oxide may be used. As the conductive metal, any one of silver (Ag), gold (Au), platinum (Pt), aluminum (Al), and copper (Cu) having excellent electrical conductivity may be used. Further, alloys of two or more elements may be used to planarize the interface structure and ensure thermal/mechanical/chemical durability. In addition, for the lower transparent conductive oxide layer formed on the substrate, a material with light transmission may be applied instead, even though the material has low electrical conductivity. For example, metal oxides such as $SiO_2$ and $Al_2O_3$, nitrides such as SiNx and AlN, and fluorides such as $MgF_2$ may be applied as the lower transparent conductive oxide layer. The transparent conductive oxide and the conductive metal may be stacked by physical vapor deposition (PVD) or chemical vapor deposition (CVD).

Figure 3B:
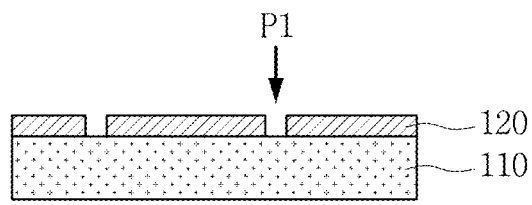

In the state in which the back transparent electrode 120 is stacked on the transparent substrate 110, a predetermined area of the back transparent electrode 120 is scribed along a scribing line, such that the back transparent electrode 120 is divided into a plurality of cells, and the back transparent electrode 120 between the adjacent cells is insulated (see FIG. 3B (S102)). In this case, the scribing line is referred to as region P1. The back transparent electrode 120 is divided into the plurality of cells by region P1, and the back transparent electrode 120 between the cells is electrically insulated by region P1. The scribing process for region P1 and the scribing process for regions P2 and P3 to be described below may be performed by using a laser.

Figure 3C:
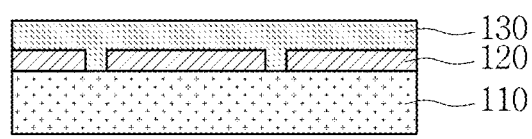
Figure 3D:
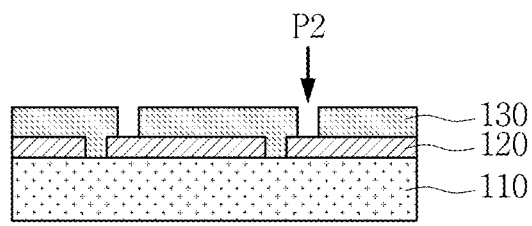

Next, the light absorption layer 130 is stacked on the front surface of the back transparent electrode 120 (see FIG. 3C (S103)). Therefore, region P1 is also filled with the light absorption layer 130 as the light absorption layer 130 is stacked on the back transparent electrode 120. The light absorption layer 130 serves to create electron-positive hole pairs by means of the photoelectric conversion of the received light. In one embodiment, the light absorption layer 130 may be made of $CuIn_{1-x}Ga_x(Se, S)_2$. However, the present disclosure is not limited thereto. Then, the back transparent electrode 120 is exposed by scribing the light absorption layer 130 along region P2 (see FIG. 3D (S104)).

Figure 3E:
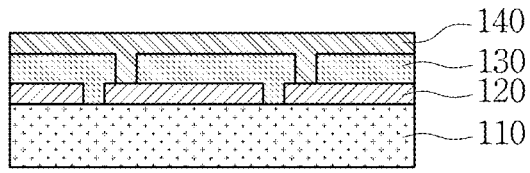

In the above-mentioned state, the front transparent electrode 140 is stacked on the front surface of the light absorption layer 130 (see FIG. 3E (S105)). In this case, region P2 is also filled with the front transparent electrode 140 as the front transparent electrode 140 is stacked on the light absorption layer 130. As region P2 is filled with the front transparent electrode 140, the front transparent electrode 140 and the back transparent electrode 120 are electrically connected. The front transparent electrode 140 may be configured by the single layer made of the transparent conductive oxide (TCO).

Figure 3F:
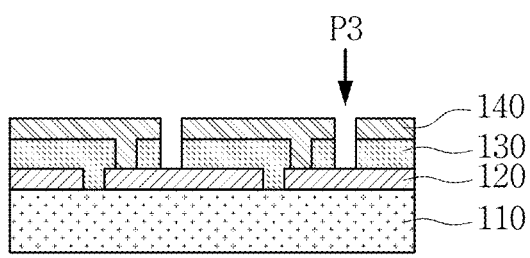
Figure 3G:
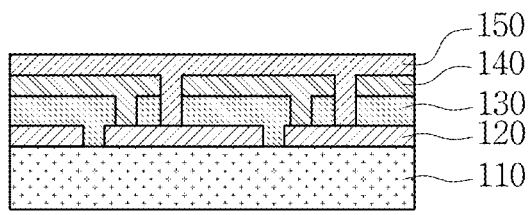

In the state in which the front transparent electrode 140 is stacked, the front transparent electrode 140 between the adjacent cells is insulated by scribing the front transparent electrode 140 and the light absorption layer 130 along region P3 (see FIG. 3F (S106)). Then, the front color layer 150 is stacked on the front surface of the front transparent electrode 140 so that region P3 is filled (see FIG. 3G (S107)).

The front color layer 150 has a shape in which two types of transparent thin-film layers having different light refractive indexes are alternately and repeatedly stacked. The front color layer 150 has a basic structure of a distributed Bragg reflective filter (DBR) in which two materials having different light refractive indexes are periodically and repeatedly stacked with a quarter-wavelength thickness. The front color layer 150 is characterized in that only the light with a specific targeted wavelength band is selectively reflected, whereas the light with the remaining wavelength ranges is transmitted and reaches the light absorption layer. As the light absorption layer selectively reflects only the light with a particular wavelength range while transmitting light with all other wavelengths so that the transmitted light is absorbed by the light absorption layer, a loss of receiving light by the front color layer 150 is minimized. In addition, it is possible to selectively implement the color exhibited by the front color layer 150 by controlling a reflection center wavelength by adjusting thicknesses of the two types of transparent thin-film materials having different light refractive indexes. On the premise that transparency is ensured at a predetermined level or higher, various materials may be applied to the transparent thin-film layer. For example, a metal oxide may be applied as a transparent material. In one embodiment, $Al_2O_3$ and $SiO_2$ may be applied as the two types of metal oxides having different light refractive indexes, and the front color layer 150 may be configured by alternately and repeatedly stacking $Al_2O_3$ and $SiO_2$. In addition, various colors such as R, G, and B may be implemented by adjusting the thicknesses of $Al_2O_3$ and $SiO_2$ and the number of stacking layers.

Figure 3H:
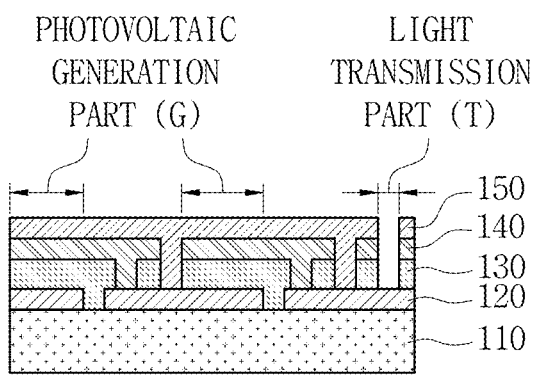
Figure 4:
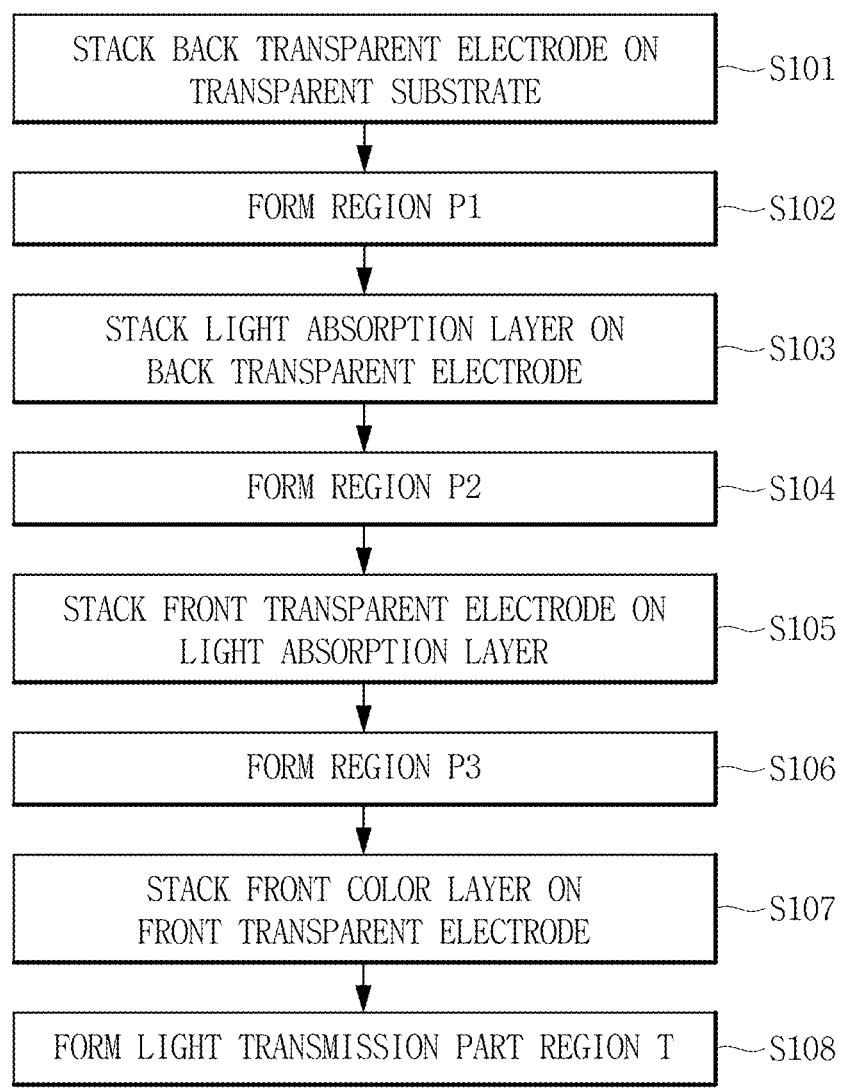
FIG. 4 is a flowchart for explaining the method of manufacturing the thin-film solar cell capable of independently adjusting transparency and color according to the embodiment of the present disclosure.

In the state in which the front color layer 150 is stacked on the front transparent electrode 140, the back transparent electrode 120 is exposed by removing the front color layer 150, the front transparent electrode 140, and the light absorption layer 130 along the light transmission part region T (see FIG. 3H (S108)). That is, the portion from which the front color layer 150, the front transparent electrode 140, and the light absorption layer 130 are selectively removed corresponds to the light transmission part region T. In the light transmission part region T, the back transparent electrode 120 is exposed to the outside. The area of the light transmission part region T may be electively adjusted. Therefore, the light transmittance of the thin-film solar cell may be controlled. As the light transmission part region T is formed, the method of manufacturing the thin-film solar cell capable of independently adjusting transparency and color according to the embodiment of the present disclosure is completed.

Referring to a cross-sectional structure of the thin-film solar cell when the light transmission part region T is completely formed, the light transmission part region T has a shape in which the back transparent electrode 120 is exposed as the front color layer 150, the front transparent electrode 140, and the light absorption layer 130 are removed. In addition, the remaining region excluding the light transmission part region T, region P1, region P2, and region P3 is the photovoltaic generation part region G and has the structure in which the back transparent electrode 120, the light absorption layer 130, the front transparent electrode 140, and the front color layer 150 are sequentially stacked on the transparent substrate 110.

With the above-mentioned structure, the light enters the front color layer 150, and the front color layer 150 exhibits the external color by reflecting the light with a particular wavelength range and transmitting the light with the remaining wavelength range so that the transmitted light is absorbed by the light absorption layer. In addition, the internal color is exhibited by the back transparent electrode 120 in the light transmission part region T. In addition, the light received by the photovoltaic generation part region G is converted into electric power by the light absorption layer 130.

As described above, it can be seen that it is possible to independently control the production of electric power by the photovoltaic generation part region G, the adjustment of the internal color by the back transparent electrode 120, the adjustment of the external color by the front color layer 150, and the adjustment of the transmittance by adjusting the area of the light transmission part region T.

The thin-film solar cell capable of independently adjusting transparency and color and the method of manufacturing the same according to the embodiment of the present disclosure have been described above. Hereinafter, the present disclosure will be more specifically described with reference to Experimental Examples.

Figure 5:
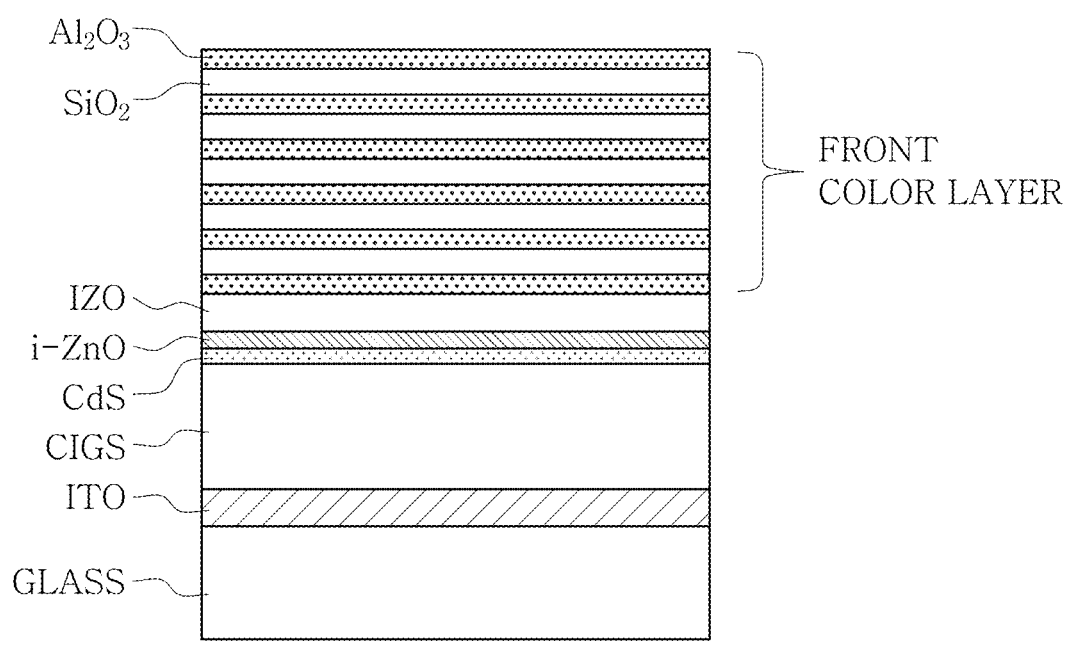
FIG. 5 is a schematic view illustrating a structure of a CIGS solar cell manufactured according to Experimental Example 1.

Experimental Example 1: Characteristics of Implementing External Color of Thin-Film Solar Cell A thin-film solar cell was completed by sequentially stacking an ITO rear electrode, a $Cu(In_{1-x}Ga_x)Se_2$(CIGS) light absorption layer, a CdS buffer layer, i-ZnO, In-doped ZnO (IZO), and $MgF_2$ on a glass substrate having a size of 6.2×6.2 $cm^2$ and then alternately and repeatedly stacking $Al_2O_3$ and $SiO_2$ five times (see FIG. 5). In this case, the ITO rear electrode was deposited by magnetron sputtering, and the CIGS light absorption layer was deposited at a substrate temperature of 450 degrees by simultaneous evaporation deposition. The CIGS light absorption layer was deposited by adjusting rates of evaporation of the elements so that Ga/(Ga+In) becomes 0.3 to 0.4 and Cu/(Ga+In) becomes 0.9 to 0.95 in the composition of the CIGS light absorption layer. The CdS buffer layer was deposited by chemical bath deposition, and the i-ZnO and IZO were deposited by sputtering. In addition, a P1 laser scribing process was applied after the deposition of the ITO rear electrode, a P2 laser scribing process was applied after the deposition of CIGS/CdS/i-ZnO, a P3 laser scribing process was applied after the deposition of the front transparent electrode (IZO) to ensure insulation between the back transparent electrodes, the electrical connection of the front transparent electrode, and the insulation between the front transparent electrodes. To form the front color layer by alternately stacking $Al_2O_3$ having a high light refractive index and $SiO_2$ having a low light refractive index, the thicknesses of $Al_2O_3$ and $SiO_2$ were adjusted as shown in Table 1 so that the reflection center wavelengths of the front color layer were 430 nm (implementation of blue color), 520 nm (implementation of green color), and 650 nm (implementation of red color) to implement R, G, B colors. In this case, $Al_2O_3$ and $SiO_2$ were deposited by RF magnetron sputtering.

TABLE 1

<Thickness of $Al_2O_3$ and $SiO_2$ and number of stacking layers for implementing R, G, and B colors>

| Center wavelength | n = stacking layer $(1H - 1L)^n - 1H$ | $Al_2O_3$, H (nm) | $SiO_2$, L (nm) |
|---|---|---|---|
| 430 | 5 | 65.4 | 75.08 |
| 520 | 5 | 79.17 | 91.13 |
| 650 | 5 | 99.04 | 114.24 |

Figure 6A:
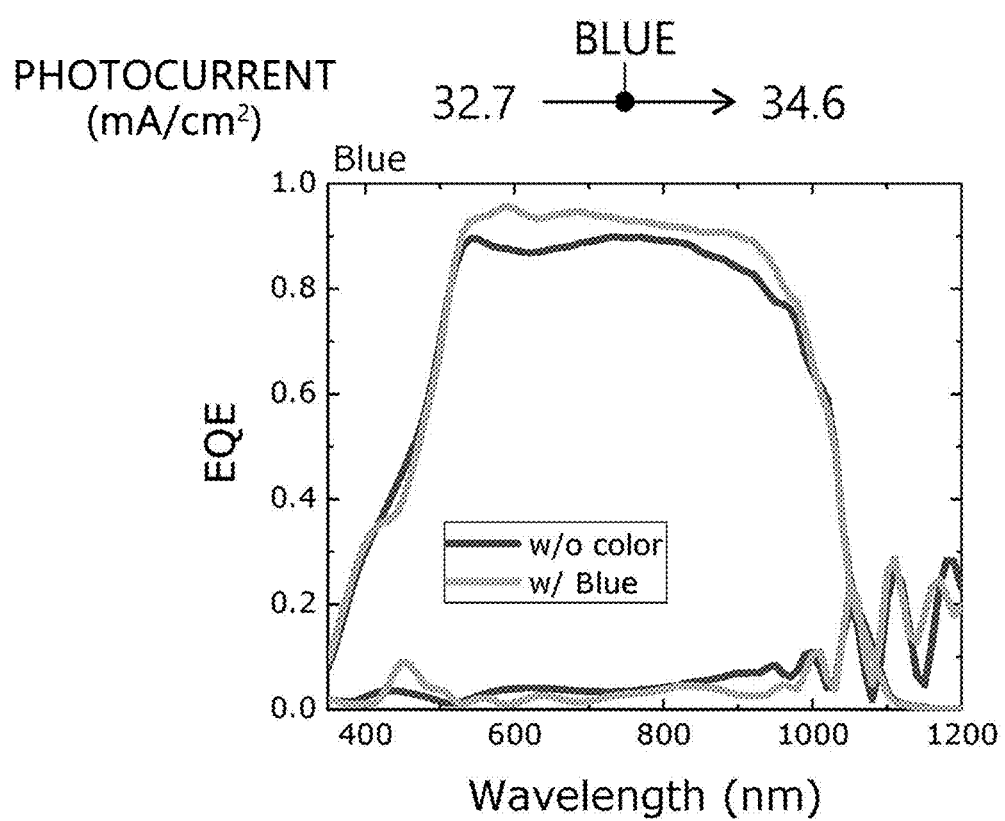
FIGS. 6A to 6C are graphs illustrating experimental results showing changes in quantum efficiency and photocurrent before and after the CIGS solar cell manufactured according to Experimental Example 1 is applied to a front color layer.
Figure 6B:
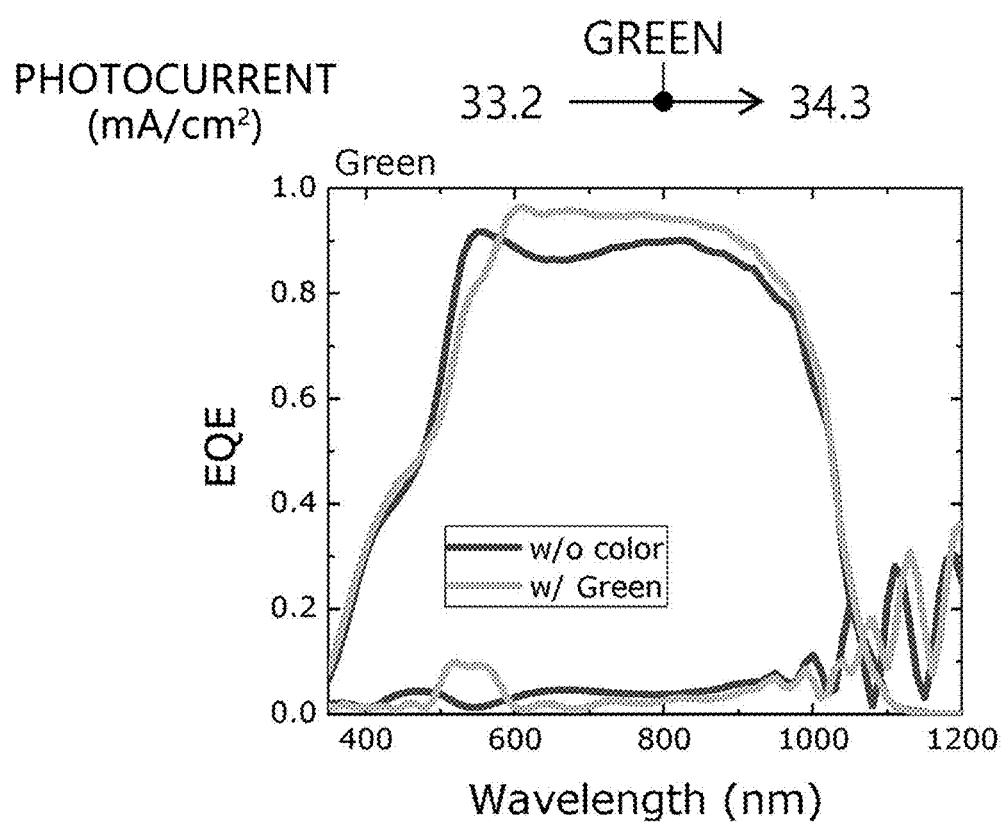
Figure 6C:
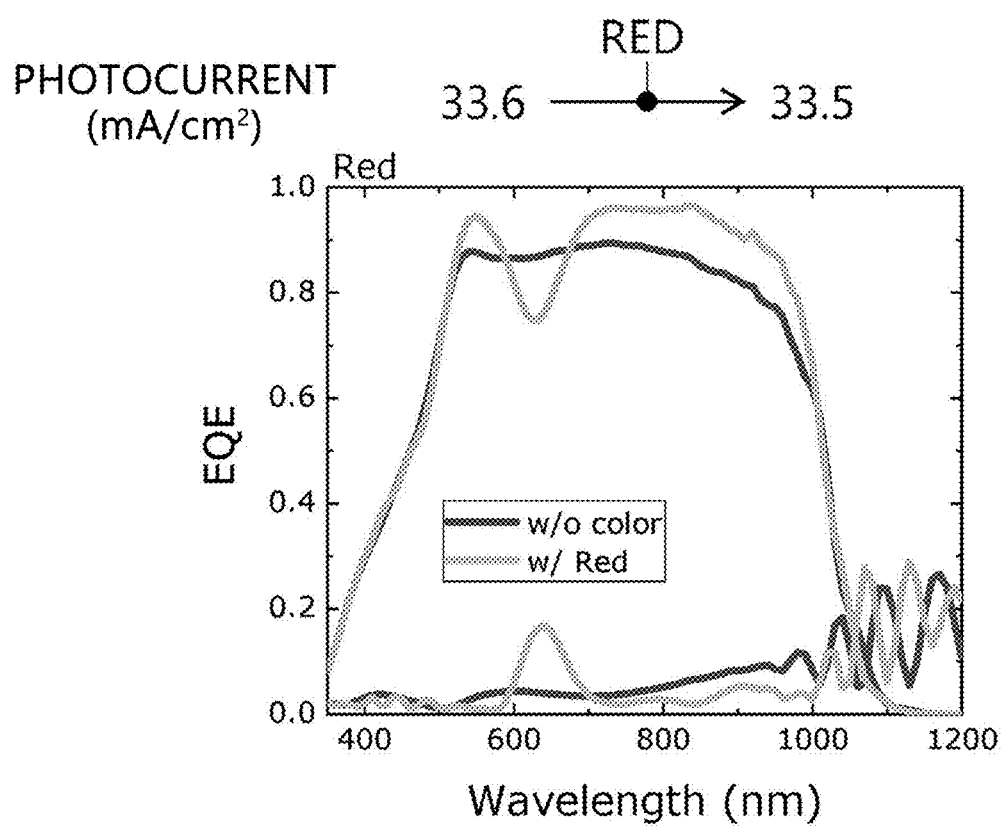

As a result of applying the front color layer to the CIGS solar cell as in Experimental Example 1, as illustrated in FIGS. 6A to 6C, the quantum efficiency measured in the CIGS solar cell to which blue, green, and red were applied was decreased because the reflection with a predetermined band width was increased at center wavelengths (430 nm, 520 nm, and 650 nm), and the quantum efficiency was decreased in the wavelength band. Because the reflection in the other wavelength band was suppressed, the quantum efficiency was increased. As a result, due to the characteristics of the CIGS solar cell with low short-wavelength quantum efficiency, the photocurrent was significantly increased when applying blue, and the increase rate of the photocurrent was decreased as the center wavelength was increased to green and red. In each of FIGS. 6A to 6C, the blue, green, and red graphs represent the quantum efficiency of the CIGS solar cell to which the front color layer is applied, and the black graph represents the quantum efficiency of the CIGS solar cell to which the front color layer is not applied.

Further, to implement the colored transparent solar cell module, a rear surface (a surface opposite to a surface on which a solar cell thin-film layer was implemented) of a CIGS solar cell mini-module, to which a surface color layer was applied, was irradiated with a picosecond laser with a wavelength of 532 nm to remove CIGS/CdS/i-ZnO/TCO/ front color layers, such that the light transmission part T was implemented, and a R, G, B colored semi-transparent CIGS module was manufactured. As a result, it was ascertained that the external color of the thin-film solar cell designed so that the reflection center wavelength of the front color layer had 430 nm was a blue color. Further, it was ascertained that the external color of the thin-film solar cell designed to have a reflection center wavelength of 530 nm was a green color, and the external color of the thin-film solar cell designed to have a reflection center wavelength of 630 nm was a red color.

Figure 7A:
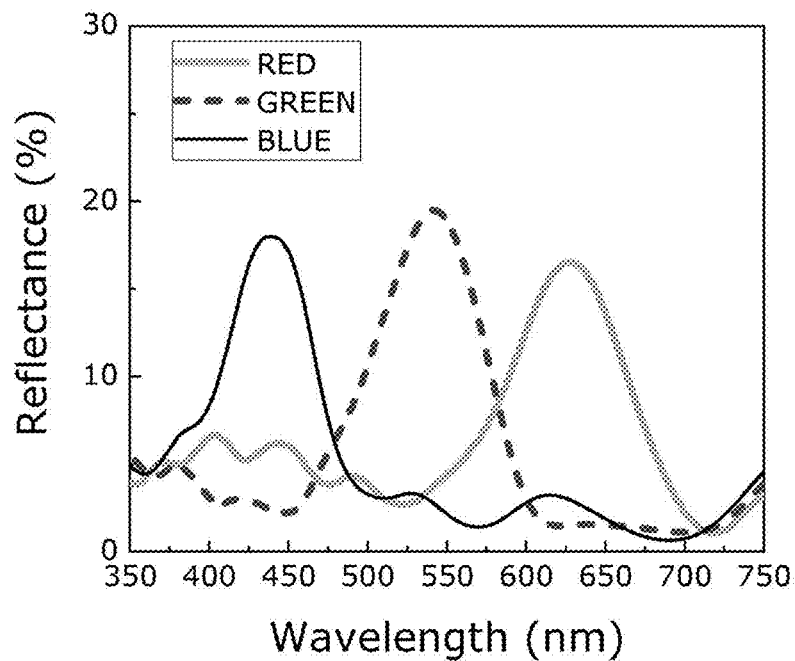
FIGS. 7A and 7B are graphs illustrating experimental results respectively showing light reflection and transmission spectra measured from a colored semi-transparent CIGS solar cell module.
Figure 7B:
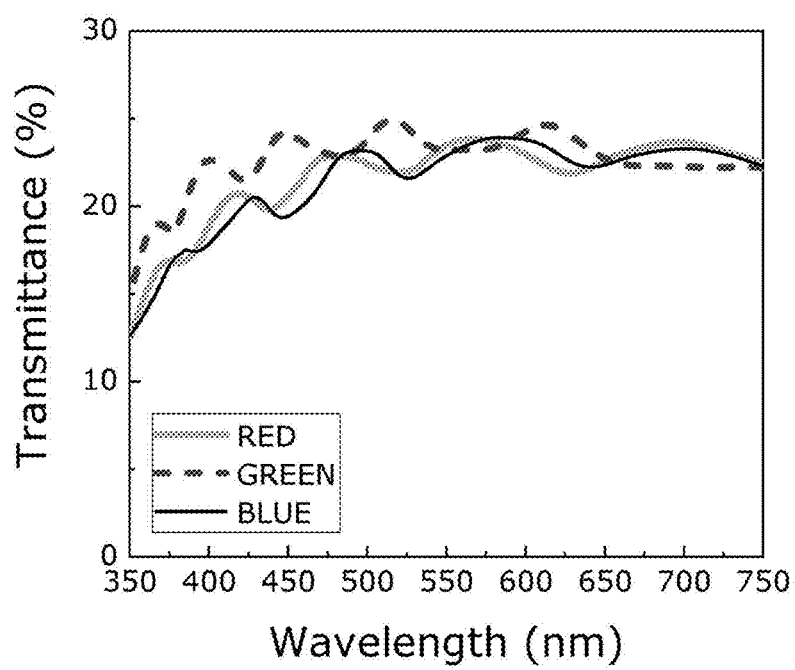

In addition, as a result of measuring the light reflected in the R, G, B colored semi-transparent CIGS module and the light transmitted by the R, G, B colored semi-transparent CIGS module for each wavelength by using a UV-visible spectrometer, as illustrated in FIGS. 7A and 7B, the reflection spectrum shows that the reflection strongly occurred only in a predetermined width band of the center wavelength similar to the design, whereas the transmission spectrum does not show a strong signal for a particular wavelength band even though there was interference by ITO. This experimental result means that the external color may be implemented well by the front color layer applied in the present embodiment, and excellent light transmission may be ensured.

Experimental Example 2: Cell Efficiency of Thin-Film Solar Cell to which Back Transparent Electrode Having Three-Layer Structure is Applied The cell efficiency characteristics were evaluated with respect to the thin-film solar cell to which the ITO single layer was applied as the back transparent electrode and the thin-film solar cell to which the ITO/Ag/ITO three-layer was applied as the back transparent electrode.

In case that the ITO single layer was applied, ITO with a thickness of 600 nm was applied as the back transparent electrode. In case that the (ITO600), ITO/Ag/ITO three-layer was applied, two cases of ITO/Ag/ITO=50 nm/10 nm/250 nm (OMO A) and ITO/Ag/ITO=150 nm/10 nm/150 nm (OMO B) were set. Then, the experiments were performed. The remaining constituent elements, except for the back transparent electrode, were manufactured by applying the process identical to the process of Experimental Example 1.

Figure 8:
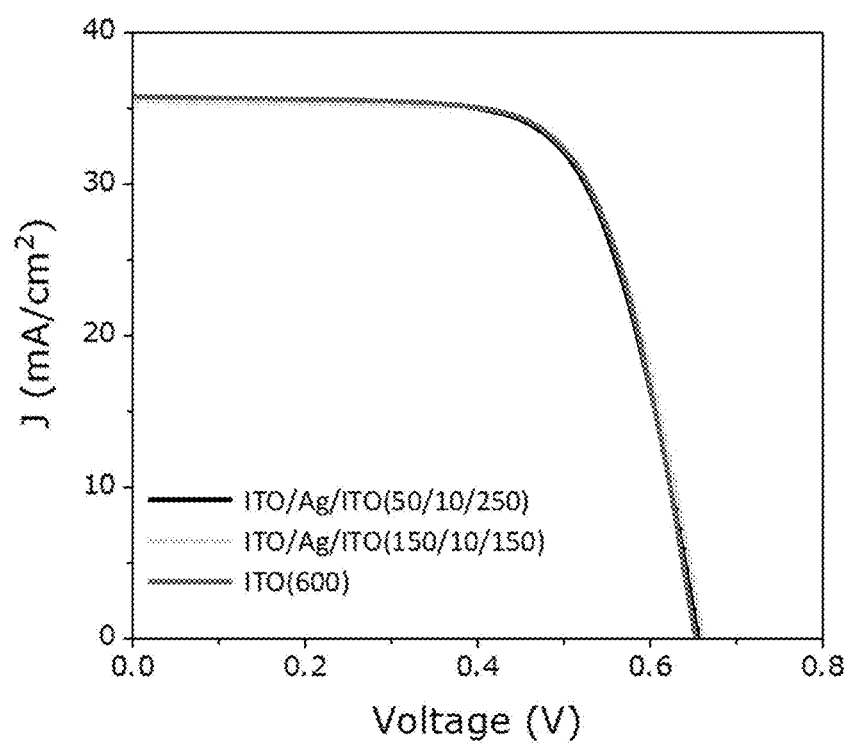
FIG. 8 illustrates current density-voltage curves of CIGS solar cells to which a back transparent electrode ITO layer of 600 nm, a lower ITO layer of 50 nm/Ag layer of 10 nm/upper ITO layer of 250 nm, and a lower ITO layer of 150 nm/Ag layer of 10 nm/upper ITO layer of 150 nm are respectively applied.

The current-voltage curves were measured while emitting light with intensity of 1 sun to the thin-film solar cells, and the measurement results were compared, as shown in FIG. 8. The cell efficiency factors shown in Table 2 below were calculated from FIG. 8. ITO(600) indicates cell efficiency of 16.2%, OMO A indicates cell efficiency of 16.1%, and OMO B indicates cell efficiency of 16.2%. It can be seen that even though the back transparent electrode having the three-layer structure is applied and even though ITO of 300 nm, which is half a thickness of ITO(600) is applied, it is possible to ensure cell efficiency almost identical to that of the ITO(600) thin-film solar cell.

TABLE 2

<Electrical characteristics of thin-film solar cells>

| 3 × 3 cm² | efficiency [%] | $V_{OC}$ [V] | $J_{SC}$ [mA/cm²] | FF [%] |
|---|---|---|---|---|
| OMO A ITO/Ag/ITO (50/10/250) | 16.1 | 0.656 | 35.5 | 69.1 |
| OMO B ITO/Ag/ITO (150/10/150) | 16.2 | 0.661 | 35.4 | 69.0 |
| ITO(600) | 16.2 | 0.659 | 35.3 | 69.6 |

Experimental Example 3: Characteristics of Implementing Internal Color by Back Transparent Electrode It was ascertained from Experimental Example 2 that the internal color was implemented by adjusting the ITO thickness in a state in which it was ascertained that the cell efficiency of the thin-film solar cell was not decreased even though the back transparent electrode having the three-layer structure was applied and the ITO thickness was changed.

Specifically, the light transmission spectrum in the visible light area, in which light was transmitted through the three layers, was continuously changed when Ag of 15 nm was applied to the back transparent electrode having the three-layer structure, a total thickness of the ITO was set to 100, 150, 200, 250, and 300 nm, and the thicknesses of the upper ITO and the lower ITO were changed under a condition of the total thickness of the ITO. The light transmission spectrum, which was obtained from the three layers having given thicknesses, was calculated by using the standard energy distribution of light and tristimulus values specified by the CIE (International Commission on Illumination) to obtain color space values, and then the color space values were converted into standard R, G, and B values. Therefore, it was ascertained from the calculation that various colors might be implemented (see FIG. 9).

What is claimed is:

1. A thin-film solar cell capable of independently adjusting transparency and color, the thin-film solar cell comprising:
a structure in which a back transparent electrode, a light absorption layer, a front transparent electrode, and a front color layer are sequentially stacked on a transparent substrate,
wherein the back transparent electrode has a multilayer structure including a lower transparent conductive oxide layer, a conductive metal layer, and an upper transparent conductive oxide layer,
wherein the front color layer comprises alternating and repeating layers of two transparent materials having different refractive indexes to implement a distributed Bragg reflector structure,
wherein a light transmission part region, to which the back transparent electrode is exposed, is formed by removing the front color layer, the front transparent electrode, and the light absorption layer in a predetermined region, and
wherein an external color implemented by the front color layer, an internal color implemented by the back transparent electrode, and light transmittance determined by adjusting an area of the light transmission part region are independently adjustable.

2. The thin-film solar cell of claim 1, wherein the internal color exhibited by the back transparent electrode is adjustable by adjusting thicknesses of the lower and upper transparent conductive oxides.

3. The thin-film solar cell of claim 1, wherein the external color exhibited by the front color layer is adjustable by adjusting thicknesses and the number of stacking layers of the two types of transparent thin-film layers having different light refractive indexes.

4. The thin-film solar cell of claim 1, wherein the back transparent electrode is configured by a single layer made of a transparent conductive oxide.

5. The thin-film solar cell of claim 1, wherein the light absorption layer creates electron-positive hole pairs by means of photoelectric conversion of received light.

6. A method of manufacturing the thin-film solar cell of claim 1 capable of independently adjusting transparency and color, the method comprising:
stacking a back transparent electrode on a transparent substrate;
stacking a light absorption layer on the back transparent electrode;
stacking a front transparent electrode on the light absorption layer;
stacking a front color layer on the front transparent electrode; and
forming a light transmission part region, to which the back transparent electrode is exposed, by removing the front color layer, the front transparent electrode, and the light absorption layer in a particular region.

7. The method of claim 6, wherein an external color of the thin-film solar cell is implemented by the front color layer, an internal color of the thin-film solar cell is implemented by the back transparent electrode, light transmittance is determined by adjusting an area of the light transmission part region, and characteristics of the external color implemented by the front color layer, characteristics of the internal color implemented by the back transparent electrode, and characteristics of light transmittance by adjusting the area of the light transmission part region are independently adjustable.

8. The method of claim 7, wherein the back transparent electrode has a structure in which a lower transparent conductive oxide, a conductive metal, and an upper transparent conductive oxide are sequentially stacked, and the internal color exhibited by the back transparent electrode is adjustable by adjusting thicknesses of the lower and upper transparent conductive oxides.

9. The method of claim 7, wherein the front color layer has a structure in which two types of transparent thin-film layers having different light refractive indexes are alternately and repeatedly stacked, and the external color exhibited by the front color layer is adjustable by adjusting thicknesses and the number of stacking layers of the two types of transparent thin-film layers having different light refractive indexes.

10. The method of claim 6, wherein the back transparent electrode is configured by a single layer made of a transparent conductive oxide.

11. The method of claim 6, wherein the forming of the light transmission part region, to which the back transparent electrode is exposed, by removing the front color layer, the front transparent electrode, and the light absorption layer in the particular region comprises removing the front color layer, the front transparent electrode, and the light absorption layer in the particular region by irradiating a rear surface of the substrate with a laser.

* * * * *